United States Patent [19]
Dux et al.

[11] Patent Number: 5,224,265
[45] Date of Patent: Jul. 6, 1993

[54] FABRICATION OF DISCRETE THIN FILM WIRING STRUCTURES

[75] Inventors: John B. Dux, Millbrook; Janet L. Poetzinger, Pleasant Valley; Roseanne M. Prestipino, Beacon, all of N.Y.; Kevin L. Siefering, Cary, N.C.

[73] Assignee: International Business Machines Corporation, Armonk, N.Y.

[21] Appl. No.: 783,959

[22] Filed: Oct. 29, 1991

[51] Int. Cl.$^5$ .............................................. H01K 3/10
[52] U.S. Cl. .......................................... 29/852; 29/846
[58] Field of Search .................. 29/846, 852, 853; 156/252, 324.4; 427/97; 174/251, 259, 260, 263, 266

[56] References Cited

U.S. PATENT DOCUMENTS

| | | | |
|---|---|---|---|
| 3,187,426 | 6/1965 | Prohofsky | 29/852 |
| 4,868,350 | 9/1989 | Hoffarth et al. | 174/266 |
| 5,129,142 | 7/1992 | Bindra et al. | 29/852 |
| 5,142,775 | 9/1992 | Wiley | 29/852 |

*Primary Examiner*—Mark Rosenbaum
*Assistant Examiner*—David P. Bryant
*Attorney, Agent, or Firm*—Ira David Blecker

[57] ABSTRACT

Multilayer thin film structures are fabricated in a parallel manner by creating testable sub-units and then joining them together to form a finished three-dimensional wiring matrix. Thus, there is disclosed a process for the fabrication of a thin film wiring structure including the steps of:

forming a core wiring structure which includes the steps of:
 a. providing a low expansion, metallic, patterned core material;
 b. encapsulating the core material in a dielectric material;
 c. forming vias in the dielectric material; and
 d. metallizing the dielectric material in the vias and on the surface of the dielectric material;

forming at least one cover laminate which includes dielectric material and a low expansion, metallic carrier;

laminating the at least one cover laminate to the core wiring structure wherein the dielectric material of the cover laminate is in contact with the core wiring structure;

forming vias through the cover laminate, the vias communicating with the vias in the core wiring structure; and filling the vias in the cover laminate and the core wiring structure with a conductive material, thereby forming a thin film wiring sub-unit.

Thereafter, a plurality of such sub-units are fabricated simultaneously, tested and then stacked and aligned on a stiffener, such as multilayer ceramic substrate, before being laminated to form a three-dimensional wiring matrix.

21 Claims, 4 Drawing Sheets

FABRICATION OF DISCRETE THIN FILM WIRING STRUCTURES

CROSS-REFERENCE TO RELATED APPLICATIONS

This patent application is related to U.S. Pat. application Ser. No. 07/784,281, "Structure and Process for Thin Film Interconnect" and U.S. Pat. application Ser. No. 07/784,345, "Discrete Fabrication of Multi-Layer Thin Film Wiring Structures", both of which are filed on even date herewith and both of which are herein incorporated by reference.

BACKGROUND OF THE INVENTION

1. Field of the Invention

The present invention generally relates to structure and process for multi-layer thin film wiring structures and, more particularly, to the fabrication of multi-layer thin film structures in a non-serial manner by creating testable sub-units and then joining them together to form a finished three-dimensional wiring matrix.

2. Description of the Prior Art

Fabrication of multi-layer thin film interconnect structures for high-density integrated circuits generally involves the sequential build up of metal-patterned dielectric layers on silicon or ceramic substrates. Among the various dielectric/insulator materials in thin film structures, sputtered (or PECVD) quartz, silicon nitride, and high-temperature stable polymers, especially polyimides, are most commonly used in conjunction with high-conductivity metallurgy such as aluminum/copper, gold, and/or copper.

The approach based on sequential building of each layer to form high-density wiring structures, however, suffers from the problem that every time a new layer is fabricated, the previously built layers are exposed to the entire process excursions including thermal, chemical solvents, mechanical and other stress-related operations. In addition, since the electrical performance and long-term reliability of the sequentially built structure can only be determined after the conclusion of the entire fabrication process, the finished part may have to be discarded if the performance does not meet the required specifications. This results in high cost of production and has other obvious limitations in terms of cycle time and throughput.

An alternate approach to thin film interconnect structures is based on the assembly of individual electrically testable metallized thin films (layers) which are laminated at high temperature such that metal-to-metal and dielectric-to-dielectric bonding can be achieved. This method eliminates some of the limitations of the sequential process, as each metallized dielectric layer is fabricated as a single unit which can be fully tested for the desired electrical characteristics, then multiple layers are stacked and laminated under heat and pressure. Although this method would be potentially superior to the sequential build up of layers, it has a fundamental problem with regard to the dimensional stability of the structure during both individual layer build and during the joining of the individual layers to form the composite structure. This is due to the fact that the thin polyimide films are generally fragile and flexible and are subject to deformation under thermal, mechanical or solvent-related stress conditions. This can result in pattern misalignment and distortion during layer fabrication or in the process of lamination and also when the composite structure undergoes accelerated reliability tests involving temperature and humidity excursions.

Japanese Patent No. J63-274199 (Application No. (1987) 62-108987) discloses a "Multilayer Wiring Formation Method" involving the build up of individual layers comprising polyimide insulator with copper wiring and copper/gold interface metal. This method is based on metal patterning of partially cured polyimide layers formed on a substrate, after which the layers are peeled off from the substrate, smoothed by vacuum, stacked, and then laminated in one step by heating under pressure. During this process, interlayer bonding occurs due to polymer interdiffusion at the interface which is also accompanied by full polymer cur, and at the same time gold/gold joining causes metal interconnections. However, this process suffers from the limitations of potential pattern misalignment and distortion, as mentioned above.

The following U.S. patents relate generally to methods of forming metallurgical patterns in insulator films:

U.S. Pat. No. 2,692,190 to Pritikin is concerned with a method for generating embedded metallurgy to fabricate printed circuits having large dimensions on a temporary base plate which is removed by chemical etching. After the conductor pattern is defined and an insulator, such as Teflon ®, polystyrene, etc., is applied, the base plate is removed by a selective etching process.

U.S. Pat. No. 3,181,986 to Pritikin also relates to printed circuits with the difference from the above patent being that the temporary base plate is not consumed and thus the process is less expensive.

U.S. Pat. No. 3,466,206 to Beck relates to embedded printed circuits having integral aligned through terminals exposed on both sides by a substractive etch process. The metal sheet is copper, silver, gold, brass, stainless steel, etc., and the insulator is a thermosetting or cold-setting resin, self-hardening resin or one which requires heat and pressure to cure, including epoxies, phenolics, melamine, Teflon, or composites with glass fillers.

U.S. Pat. No. 3,541,222 to Parks et al. is concerned with a connector screen or "interposer" comprising conductive connector elements embedded in a deformable insulator such that the conductive elements are protruding from both sides.

U.S. Pat. No. 4,604,160 to Murakami et al. relates to a method for fabricating a flexible printed wiring board with emphasis on the adhesion of the plating resist and the conductor pattern during the plating process.

U.S. Patent No. 4,707,657 to Boegh-Petersen is concerned with double-sided printed circuit boards of a connector assembly, thin film and thick film circuit board, and multilayer circuit board.

U.S. Pat. No. 4,438,561 to Mueller relates to a flexible circuit on a non-metallic carrier joined to a printed circuit board.

SUMMARY OF THE INVENTION

It is therefore an object of this invention to provide a high density, multilayer thin film structure and process for its manufacture wherein multiple individually testable subunits are fabricated in parallel, pretested for operational performance, and joined together to form a three dimensional wiring matrix.

It is another object of this invention to provide a base structure used in fabricating the subunits of the high density, multilayer thin film structure called a compensator which includes a metal reinforced dielectric that may support two levels of signal wiring wherein the metal reinforcement provides accurate dimensional stability and rigidity for handling and processing as well as controls the thermal expansion of the compensator and provides a electrical ground or reference plane. This reference plane also acts to electrically isolate the wiring patterns on both sides of the compensator.

It is another object of the invention to identify materials which are advantageous in forming the compensator structure where the materials provide a planar layer on which circuitry can be formed and have good adhesion with the metal reinforcement.

It is yet another object of this invention to provide structures and processes for filling the vias formed in the compensator with a conductive material. The conductive material provides electrical connection to the metallization on the compensator and is used to electrically interconnect the sub-units of the high density, multi-layer thin film structures.

It is yet another object of the invention to identify materials suitable for filling the vias formed in the compensator and especially to utilize a flowable metal loaded thermoplastic material for such a purpose.

According to the invention, high density, multilayer thin film structures are fabricated by producing a plurality of individually testable sub-units in parallel and then joining the units to form a three dimensional wiring matrix. The individually testable sub-units are called plane pair sub-units and are planar in shape and include interconnection sites on both sides.

A base structure for fabricating the plane pair sub-units is called a compensator and includes a metal reinforced dielectric with metallized circuitry formed on both its top and bottom surface. The metal reinforcement material has a thermal coefficient of expansion which may be tailored to match that of integrated circuit devices or the like which may be connected to the multilayer structure. The compensator provides dimensional stability which is important for fabricating the multilayer structure. Multiple vias are formed through the compensator to allow circuitry on either side of the compensator to be connected using metallization deposited in the via.

At least one cover laminate is now applied to the core wiring structure. The cover laminate is formed of a dielectric material and a dimensionally stable, expansion matched metal foil carrier, such as molybdenum or Invar. The expansion matches aspect of the carrier is important to maintain alignment during the lamination. In a preferred embodiment of the invention, there will be a cover laminate on either side of the core wiring structure.

The cover laminate and core wiring structure are aligned and laminated together. Then, vias are formed in the cover laminate which are in alignment with the vias in the core wiring structure. Finally, the vias in the cover laminate and core wiring structure are filled with a conductive material. The sub-units so formed can now be electrically tested and sorted.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
FIG. 1 is a cross-sectional view of an edge showing a thin metal foil that is used to form the metal core of the compensator.

Referring now to the drawings, and more particularly to FIG. 1, there is shown a foil 10 having a low thermal coefficient of expansion and a high melting point. Preferably, the thermal coefficient of expansion is in the range of 2 to 22 ppm/°C. and matches that of electronic components to be mounted on the surface of the completed structure. Suitable materials for the foil 10 include copper-Invar-copper, molybdenum, titanium, copper, tungsten, Kovar, or the like. Preferably the foil is between 1 and 2 mils thick.

Figure 2:
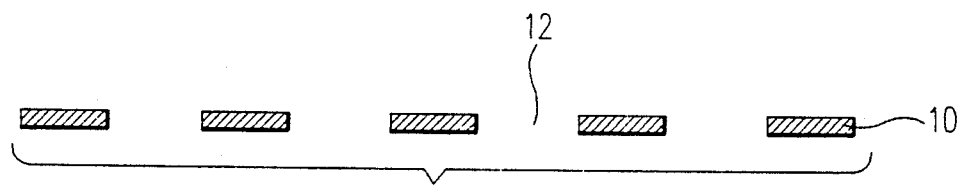
FIG. 2 is a cross-sectional view of an edge showing the metal core of the compensator after it has been patterned with holes.

FIG. 2 shows the foil 10 patterned with a plurality of holes 12. The holes 12 can be created by a variety of well known techniques such as photoprocessing, plasma etching, punching, and laser drilling. The location of the holes 12 is performed in a controlled manner since they will act as vias for metallization interconnect lines between circuitry as will be described in more detail below. The foil 10 serves as the metal reinforcement of a compensator structure described in conjunction with FIG. 5. The patterned foil 10 provides the dimensional accuracy to support high via densities and a thermal expansion match to electronic components which may be connected to the multilayer thin film structure produced. In addition, the foil 10 may serve as an electrical ground or reference plane and serves to electrically isolate wiring layers on each side of the foil 10. As a solid reference plane, the foil 10 enhances the performance of the multilayer thin film structure produced.

Figure 3:
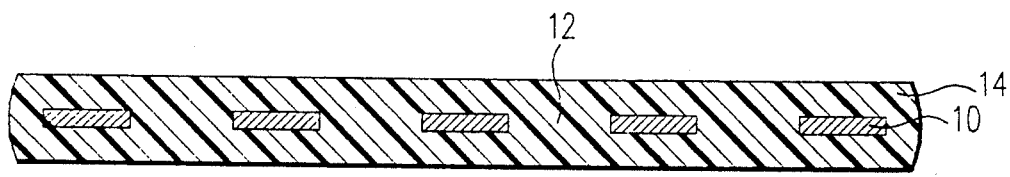
FIG. 3 is a cross-sectional view of an edge showing the metal core of the compensator after encapsulation in a dielectric.

FIG. 3 shows the foil 10 encapsulated in a dielectric material 14. The dielectric material 14 may be any of a number of different materials such as Kapton, Teflon, filled Teflon, epoxies, or the like. In a preferred embodiment, the dielectric material 14 is a fully cured and annealed thermoplastic material which has a low glass transition temperature (Tg) such as Teflon (polytetrafluoroethylene), polysulfone, or polyimide-siloxane. In addition, the dielectric material 14 may be a high Tg polymer which is coated with a low Tg polymer. The dielectric material 14 may be applied on the foil 10 by many well known techniques such as lamination, rollercoating, gas or vapor-phase polymerization, electrophoretic deposition, or injection molding. In a preferred embodiment, the fully cured, low Tg, dielectric material 14 is applied to the foil 10 by lamination. When the dielectric material 14 has a low Tg, it is capable of flowing at low temperatures so that the holes 12 of the foil 10 become filled and a planar structure is easily created. Also, when curing is not required and low Tg materials are used, the dielectric material 14 is likely to have low stress which is beneficial in handling and processing high density circuitry.

Figure 4:
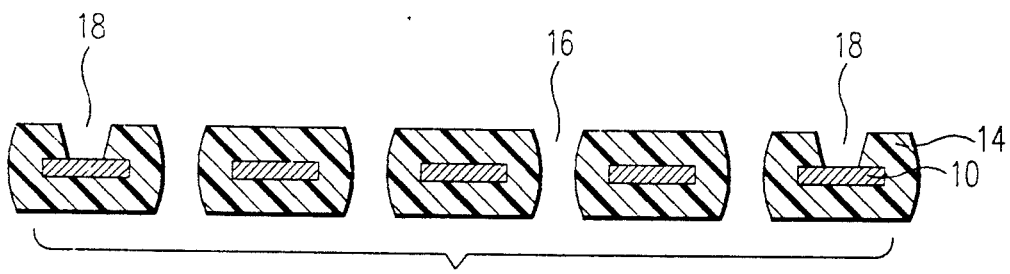
FIG. 4 is a cross-sectional view of an edge showing the encapsulated metal core after the dielectric has been patterned with holes.

FIG. 4 shows that the dielectric material 14 of the encapsulated foil 10 is re-patterned to create a plurality of vias 16 which pass completely through the structure and vias 18 which expose the foil 10. The vias 16 and 18 may be created by many standard techniques including, for example, punching, plasma etching, laser drilling, or photo-etching. The vias 16 provide a passage which allows metallization to interconnect circuitry that will be formed on the top and bottom of the structure. The vias 18 provide a passage for metallization to connect to the foil 10 when it will be used as a ground or reference plane. While FIG. 3 shows the patterned foil 10 with the dielectric material 14 filling the holes 12, using gas or vapor-phase polymerization or electrophoretic deposition as the technique for applying the dielectric material 14 has some advantages in that the polymer created conforms to the surfaces of the foil 10 and it would be possible to create a structure similar to FIG. 4, but lacking the vias 18, directly. Hence, only the vias 18 would need to be made during re-patterning.

Figure 5:
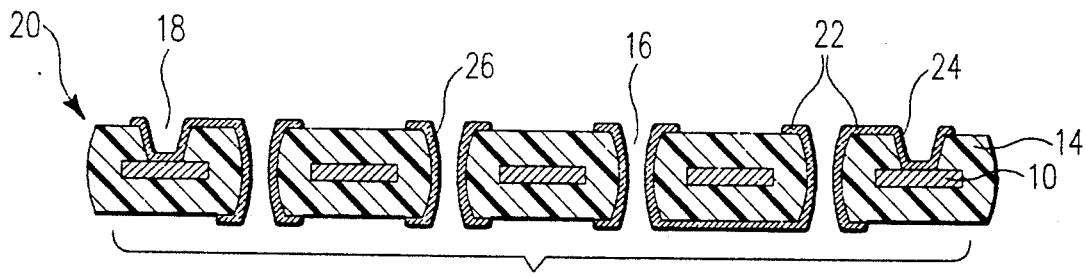
FIG. 5 is a cross-sectional view of an edge showing the patterned and encapsulated compensator metallized to form orthogonal wiring layers.

FIG. 5 shows the structure of the compensator or core wiring structure 20 which is an important part of the present invention. The compensator or core wiring structure 20 is fabricated by subjecting the re-patterned structure of FIG. 4 to a series of metallization steps which create orthogonal wiring layers 22 on the surface of the dielectric material 14, connecting lines 24 in the vias 18 which connect the wiring layers 22 to the foil 10 for grounding or reference plane purposes, and metal 26 in the vias 16 for electrically connecting the circuitry on the top and bottom surfaces of the compensator. The metallization steps can be performed by many different well known techniques including, for example, blanket plating and subtractive etching, additive plating using patterned photo-resist, sputtering evaporation, or chemical vapor deposition. The hollow via structure shown in FIG. 5 minimizes processing steps since the vias 16 can be metallized simultaneously with the orthogonal wiring 22 on the top and bottom surfaces of the compensator 20. For example, a single lithography step may be utilized to simultaneously metallize the vias 16 and the orthogonal wiring 22. During metallization, it is preferable to apply a joinable material such as gold to the metal 26 in the vias 16 in order to facilitate subsequent joining steps. At this point in the fabrication process, the compensator 20 can be inspected for defects, repaired and sorted.

Figure 6:
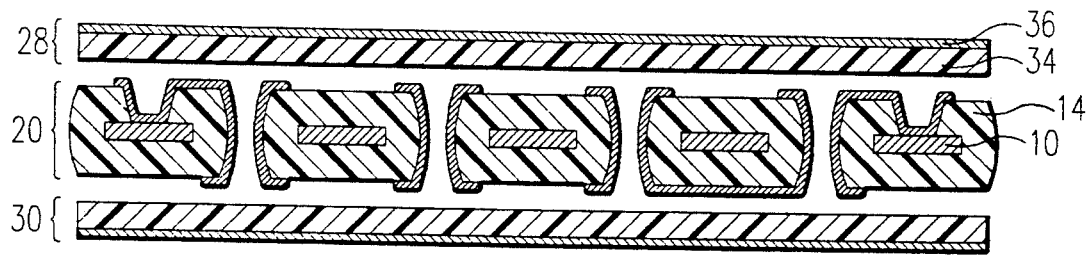
FIG. 6 is a cross-sectional view of an edge showing two cover laminates prior to lamination to the wiring core.

Referring now to FIG. 6, there are shown cover laminates according to the invention prior to lamination to the core wiring structure. While there must be at least one cover laminate 28 to fulfill the objects of the invention, in a preferred embodiment of the invention, there will be a second cover laminate 30, as well. Each of the cover laminates 28, 30 are on either side of the wiring core structure 20. The invention will hereafter be discussed with respect to the two cover laminates. It should, however, be understood that the invention pertains to those embodiments having only one cover laminate.

Each of the cover laminates are formed by laminating dielectric material 34 onto a low expansion, metallic carrier 36. Alternatively, the dielectric material 34 and low expansion, metallic carrier 36 need not be laminated together and may simply be placed upon the core wiring structure 20 in the correct order. It is important that the carrier be of a dimensionally stable, low expansion material, such as molybdenum or Invar, and match the expansion characteristics of the core material of the wiring core structure so as to maintain alignment during the lamination of the cover laminates to the wiring core structure.

Figure 7:
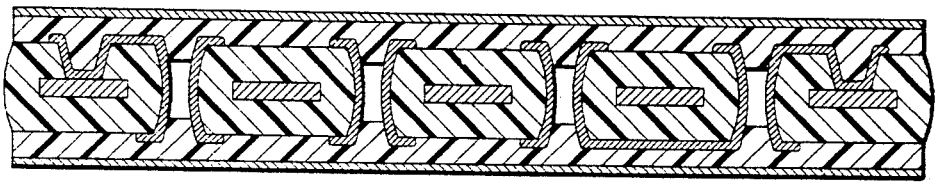
FIG. 7 is a cross-sectional view of an edge showing the wiring core with the laminated cover laminates.

As shown in FIG. 7, the cover laminates 28, 30 have been laminated to the wiring core structure 20. Lamination is usually done at moderate pressures and at a temperature above Tg of the dielectric material so that the dielectric materials of the cover laminates and wiring core structure adhere together. If the cover laminates 28, 30 had not been laminated together prior to joining with the wiring core structure 20, the cover laminates 28, 30 would be laminated together in this step at the same time that they are laminated to the core wiring structure 20.

At this point in the processing sequence, the metallic carrier 36 is removed by etching or other technique, leaving the underlying dielectric material 34 exposed. Vias may be formed in the dielectric material by any of the methods discussed previously with respect to the core wiring structure. These vias are in communication with vias 16 of the core wiring structure. Thereafter, the vias in both the core wiring structure and the cover laminates are filled with a conductive material 32.

The vias may be filled by a plating or other metallization process. However, in a preferred embodiment, the conductive material is a metal-loaded thermoplastic adhesive material. The thermoplastic material is selected for solubility in a solvent which allows it to be mixed with metal powders such as silver and gold, for example, to make a screenable paste. Suitable thermoplastic materials and solvents would be the following: polysulfone, polyimide-siloxane. The paste is then screened into holes formed in the dielectric and the solvents are allowed to dry. Preferably, the screenable conductive paste is tailored such that the electrical via joining and dielectric bonding are compatible. Further advantages of the thick film screening procedure are that no additional photolithographic processes are required and the technique is contamination insensitive. The resulting thin-film wiring sub-unit is shown in FIG. 10A.

Instead of removing the carrier material after lamination, the vias may be formed in the cover laminate while the carrier material 36 remains. Then, the conductive paste may be screened through the vias in the cover laminate 28 while using the perforated carrier material 36 as a screening mask. This embodiment is shown in FIG. 10B. Then, the carrier material 36 may be removed, if desired, by etching or other process to result in a sub-unit similar to that shown in FIG. 10A.

Figure 8A:
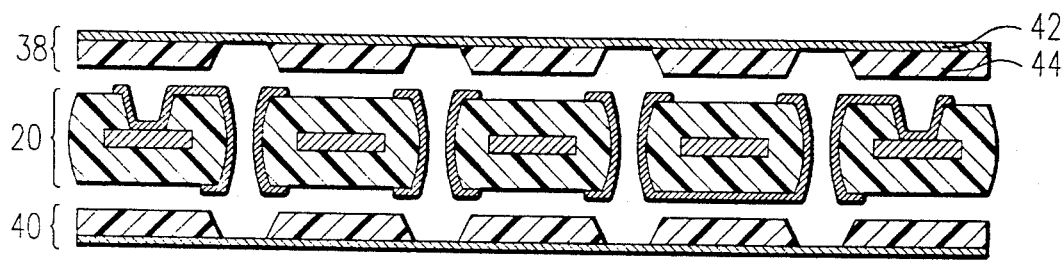
FIGS. 8A and 8B show an alternative embodiment of two cover laminates with holes formed in respective carriers prior to lamination to the wiring core.

As discussed so far, the cover laminates 28, 30 have been laminated to the core wiring structure 20 and then vias are formed in the cover laminates. In another embodiment of the invention, as shown in FIGS. 8 and 9, vias are formed in the cover laminates prior to being laminated to the core wiring structure. Referring now to FIG. 8A, cover laminates 38, 40 are shown having vias already formed in the dielectric material 44. The vias do not extend through the entire thickness of the cover laminates 38, 40. That is, the metallic carrier 42 has not been perforated by the vias. Such a structure as shown in FIG. 8A may be formed by laminating the dielectric material 44 to the metallic carrier 42 and then ablating the vias or the vias may be formed in the dielectric material 44 prior to lamination to the metallic carrier 42. The finished structure after laminating to the core wiring structure 20 is shown in FIG. 9. Thereafter, the metallic carrier 42 may be perforated for deposition of the conductive material or entirely removed as discussed previously.

Figure 8B:
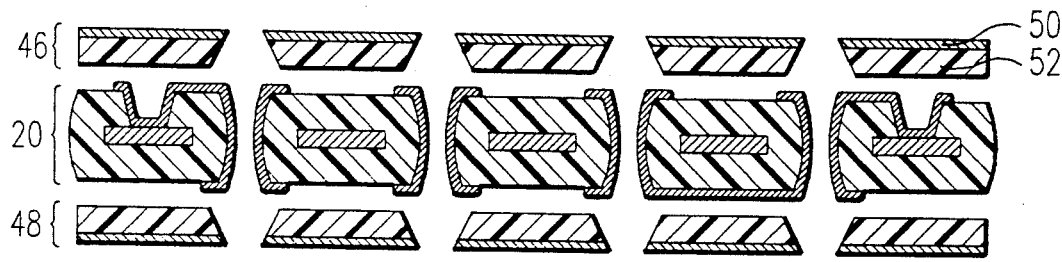
Figure 9:
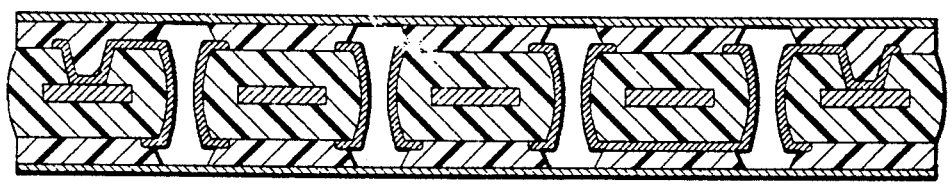
FIG. 9 is a cross-sectional view of an edge showing the wiring core laminated to the cover laminates of FIG. 8A.

A variation on this embodiment is shown in FIG. 8B. There, the cover laminates 46, 48 have vias entirely through their thickness. A convenient way of forming these cover laminates 46 48 is to laminate the dielectric material 52 with the metallic carrier 50 and then punch or laser drill the vias. The structure after lamination to the core wiring structure 20 would look similar to that shown in FIG. 9 except that the metallic carrier would be perforated.

Figure 10:
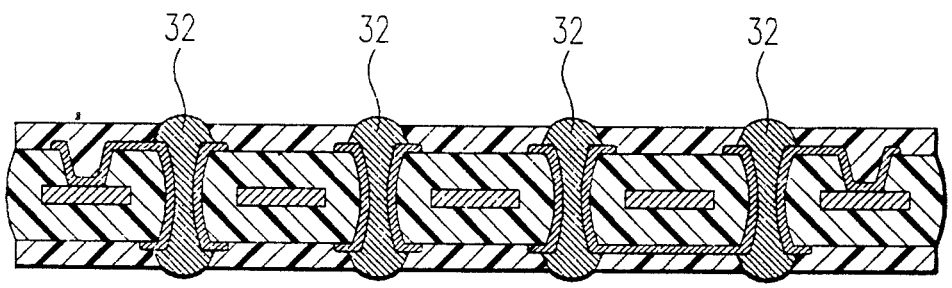
FIGS. 10A and 10B show alternative embodiments of the wiring layers of FIG. 7 with the vias filled with a conductive paste.
Figure 10:
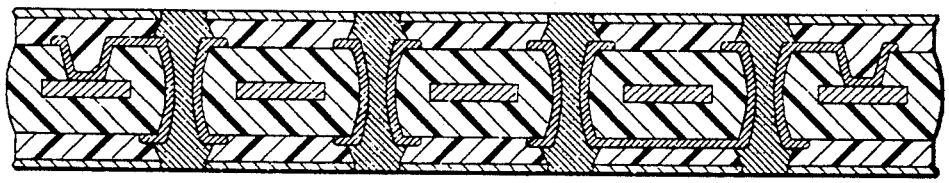

After depositing the conductive material, the structures in FIGS. 8 and 9 would appear as that shown in FIGS. 10.

An advantage of the structures shown in FIGS. 8 is that the dielectric material does not have to be removed from the vias 16 of the core wiring structure after the cover laminates are laminated to the core wiring structure. With certain polymers, such as Teflon, removing the polymers from the vias 16 can be a problem. By removing the dielectric material from the vias prior to laminating, this problem can thus be obviated.

As is evident, the wiring sub-units shown in FIGS. 10 may perform several wiring functions. In a preferred embodiment of the invention, the wiring sub-units form plane pairs.

. Each of the wiring sub-units so formed can now be electrically tested and sorted.

Figure 11:
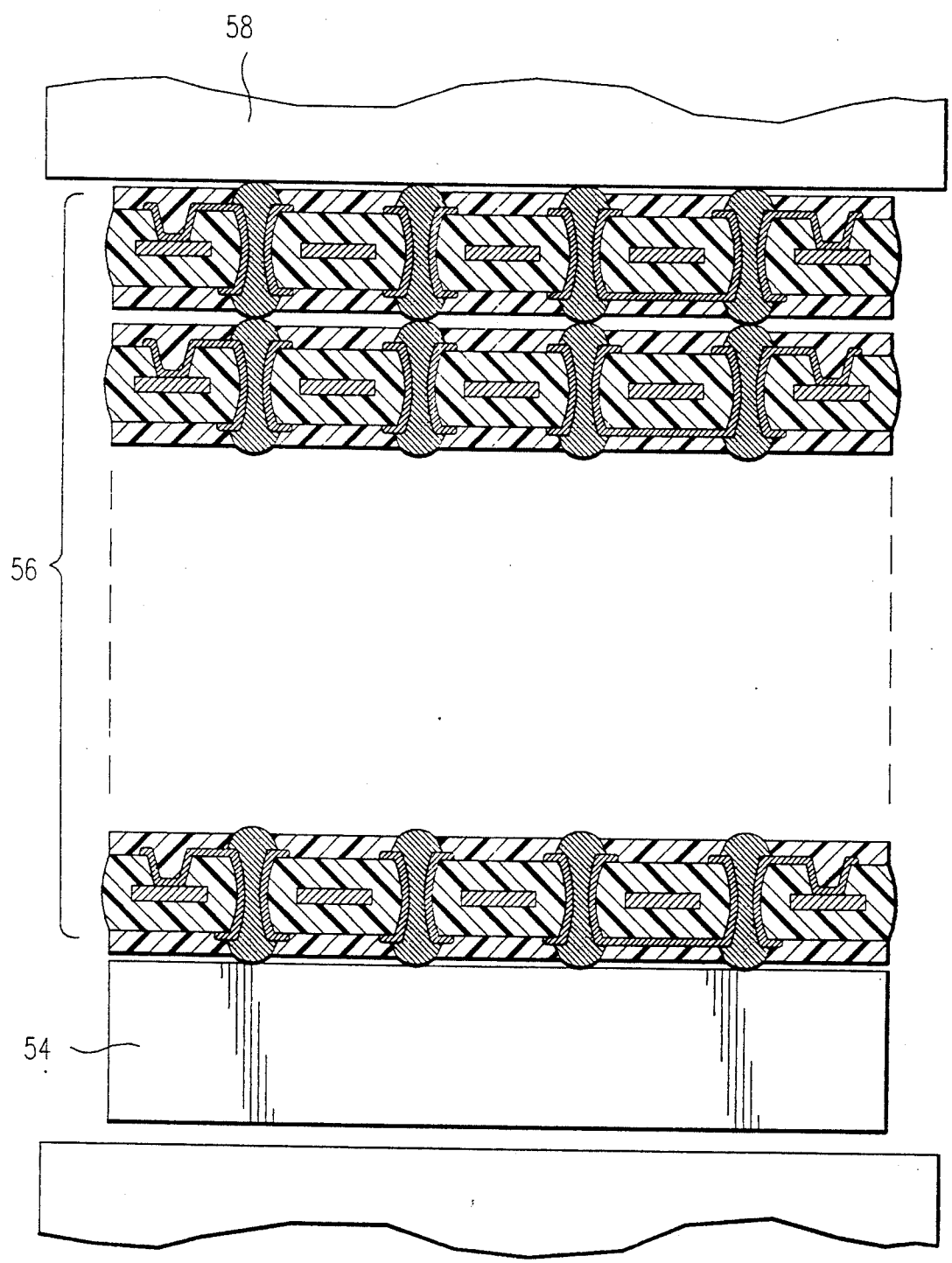
FIG. 11 is a side view showing a stack of wiring layers of the type shown in FIGS. 10A on a stiffener in a lamination press.

The tested sub-units are now stacked and aligned (to bring the electrically conductive via joining surfaces into contact) onto a stiffener 54, as shown in FIG. 11. The stiffener 54 can also have an electrical function such as a ground plane or power distribution and wiring plane. Examples of such a stiffener would be a multilayer ceramic substrate. The whole assembly 56 is now subjected to elevated temperatures and pressures in a lamination press 58 to interdiffuse electrical joints at the via interfaces and to interdiffuse the dielectric interfaces.

This last step completes the formation of the three-dimensional wiring matrix. The unit is then electrically tested and sent on to have the electrical components joined along with the connectors and cooling hardware.

The fabrication process according to the invention has several benefits. First, fabrication time is reduced because all sub-units can be created simultaneously allowing a multilayer thin film structure to be manufactured in a similar amount of time as a single layer structure. Second, since all sub-units are testable, defects can be screened out before joining. This results in a multilayer structure yield which is nearly equal to that of a single layer structure. Third, the wiring structures produced according to the invention can be joined to any expansion matched surface thus allowing them to complement and/or supplement existing packaging technologies, including multilayer ceramic, glass epoxy boards, etc. Fourth, by careful selection of the dielectric material and metal conductors, the individual sub-units, and thus the finished structure, can have a tailored thermal expansion so that many types of electronic components, such as flip-chip ICs, surface mount components, tab-bonded components, and wire bonded components, can be joined to the surface. Fifth, a variety of low thermal coefficient of expansion dielectrics in varying thicknesses along with a corresponding scaling of wiring dimensions allow both high and low density sub-units to coexist within the same structure. The resulting electronic package is therefore totally tailorable to the electrical requirements.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What we claim is:

1. A process for the fabrication of a thin film wiring structure comprising the steps of:
   forming a core wiring structure comprising the steps of:
   a. providing a low expansion, metallic core material patterned with a plurality of holes;
   b. encapsulating the core material in a dielectric material;
   c. forming vias in said dielectric material; and
   d. metallizing said dielectric material in said vias and on the surface of said dielectric material; and
   forming at least one cover laminate comprising dielectric material and a a low expansion, metallic carrier;
   laminating said at least one cover laminate to said core wiring structure wherein the dielectric material of said cover laminate is in contact with said core wiring structure;
   optionally removing the low expansion metallic carrier from the at least one cover laminate;
   forming vias through the thickness of the cover laminate, said vias in alignment with the vias in said core wiring structure;
   and filling said vias in said cover laminate and said core wiring structure with a conductive material thereby forming a thin film wiring sub-unit.

2. The process of claim 1 wherein the step of filling said vias comprises screening a conductive paste into said vias.

3. The process of claim 2 wherein said conductive paste comprises a metal-loaded thermoplastic material.

4. The process of claim 2 wherein said low expansion, metallic carrier acts as a mask for the screening of said vias.

5. The process of claim 2 further comprising the step of removing the low expansion, metallic carrier after the step of filling said vias.

6. The process of claim 1 wherein there are two cover laminates with one cover laminate on either side of said core wiring structure.

7. The process of claim 1 wherein the steps of forming at least one cover laminate includes laminating said dielectric material onto said low expansion, metallic carrier.

8. The process of claim 1 wherein a plurality of said thin film wiring sub-units are fabricated, and said process further comprises the steps of:
   removing the low expansion, metallic carrier from the at least one cover laminate of each wiring sub-unit;
   stacking and aligning the vias of said plurality of sub-units on a stiffener; and
   laminating said stacked and aligned sub-units to form a three-dimensional wiring matrix as a unitary structure with said stiffener.

9. The process of claim 1 further comprising a plurality of thin film wiring sub-units wherein each of said thin film wiring sub-units comprises a plane pair.

10. The process of claim 1 wherein said low expansion, metallic, patterned core material and said low expansion, metallic carrier have a similar thermal coefficient of expansion.

11. A process for the fabrication of a thin film wiring structure comprising the steps of:
   forming a core wiring structure comprising the steps of:
      a. providing a low expansion, metallic core material, patterned with a plurality of holes;
      b. encapsulating the core material in a dielectric material;
      c. forming vias in said dielectric material; and
      d. metallizing said dielectric material in said vias and on the surface of said dielectric material;
   forming at least one cover laminate comprising dielectric material and a low expansion, metallic carrier, said cover laminate having vias through at least a portion of its thickness;
   laminating said at least one cover laminate to said core wiring structure wherein the dielectric material of said cover laminate is in contact with said core wiring structure and wherein said vias in said cover laminate are in alignment with the vias in said core wiring structure;
   optionally removing the low expansion metallic carrier from the at least one cover laminate; and
   filling said vias in said cover laminate and said core wiring structure with a conductive material, thereby forming a thin film wiring sub-unit.

12. The process of claim 11 wherein the step of forming said cover laminate includes forming vias in said dielectric material prior to laminating said dielectric material and said metallic carrier.

13. The process of claim 11 wherein the step of filling said vias comprises screening a conductive paste into said vias.

14. The process of claim 13 wherein said conductive paste comprises a metal-loaded thermoplastic material.

15. The process of claim 13 wherein said low expansion, metallic carrier acts as a mask for the screening of said vias.

16. The process of claim 13 further comprising the step of removing the low expansion, metallic carrier after the step of filling said vias.

17. The process of claim 11 wherein there are two cover laminates with one cover laminate on either side of said core wiring structure.

18. The process of claim 11 wherein the step of forming at least one cover laminate includes laminating said dielectric material onto said low expansion, metallic carrier.

19. The process of claim 11 wherein a plurality of said thin film wiring sub-units are fabricated, and said process further comprises the steps of:
   removing the low expansion, metallic carrier from the at least one cover laminate of each cover wiring sub-unit;
   stacking and aligning the vias of said plurality of sub-units on a stiffener; and
   laminating said stacked and aligned sub-units to form a three-dimensional wiring matrix as a unitary structure with said stiffener.

20. The process of claim 11 further comprising a plurality of thin film wiring sub-units wherein each of said thin film wiring sub-units comprises a plane pair.

21. The process of claim 11 wherein said low expansion, metallic, patterned core material and said low expansion, metallic carrier have a similar thermal coefficient of expansion.

* * * * *